(12) United States Patent
Ingimundarson

(10) Patent No.: US 9,397,667 B2
(45) Date of Patent: Jul. 19, 2016

(54) SHARED DIVIDE BY N CLOCK DIVIDER

(71) Applicant: Texas Instruments Deutschland GmbH, Freising (DE)

(72) Inventor: Árni Ingimundarson, Freising (DE)

(73) Assignee: TEXAS INSTRUMENTS DEUTSCHLAND GMBH, Freising (DE)

(*) Notice: Subject to any disclaimer, the term of this patent is extended or adjusted under 35 U.S.C. 154(b) by 0 days.

(21) Appl. No.: 14/477,576

(22) Filed: Sep. 4, 2014

(65) Prior Publication Data

US 2016/0072508 A1    Mar. 10, 2016

(51) Int. Cl.
H03K 21/02 (2006.01)

(52) U.S. Cl.
CPC .................. H03K 21/026 (2013.01)

(58) Field of Classification Search
CPC ............. G06F 1/00; G06F 1/08; G06F 7/00; G06F 7/68; H03K 21/00; H03K 21/026; H03K 23/00; H03K 23/667; H03K 23/68; H03K 5/00; H03K 5/00006
USPC ........................................................ 327/115
See application file for complete search history.

(56) References Cited

U.S. PATENT DOCUMENTS

| | | | |
|---|---|---|---|
| 7,053,682 B2 | 5/2006 | Kuzmenka | |
| 7,139,361 B1* | 11/2006 | Nguyen | H03K 5/15066 327/107 |
| 2005/0273738 A1* | 12/2005 | Byrn | G06F 9/4446 716/102 |
| 2006/0220938 A1 | 10/2006 | Leung et al. | |
| 2008/0094109 A1 | 4/2008 | Farjad-rad et al. | |
| 2010/0001760 A1* | 1/2010 | Balasubramanian | G01K 7/015 326/38 |
| 2012/0194220 A1 | 8/2012 | Cavin | |

FOREIGN PATENT DOCUMENTS

WO    WO2012168533    12/2012

OTHER PUBLICATIONS

International Search Report for corresponding PCT Application No. PCT/US2015/048657, dated Dec. 24, 2015 (2 pages).

* cited by examiner

Primary Examiner — John Poos
Assistant Examiner — David Mattison
(74) Attorney, Agent, or Firm — John R. Pessetto; Frank D. Cimino

(57) ABSTRACT

A method of providing multiple clock frequencies for an integrated circuit having a plurality of modules. A reference clock signal (fin) is frequency division processed to generate sub-divider outputs of fin divided by a plurality of different (i) prime numbers and (ii) prime numbers raised to an integer power to collectively provide a plurality of prime number-based clock signals that each have a frequency divider factor (divider factor) in a predetermined divider range. For at least a portion of other divider factors, two or more of the sub-divider outputs are combined to generate additional clock signals that each provide an additional divider factor. A first module frequency selects at least a first selected clock signal from the prime number-based clock signals and additional clock signals, and a second module frequency selects at least a second selected clock signal from the prime number-based clock signals and additional clock signals.

16 Claims, 6 Drawing Sheets

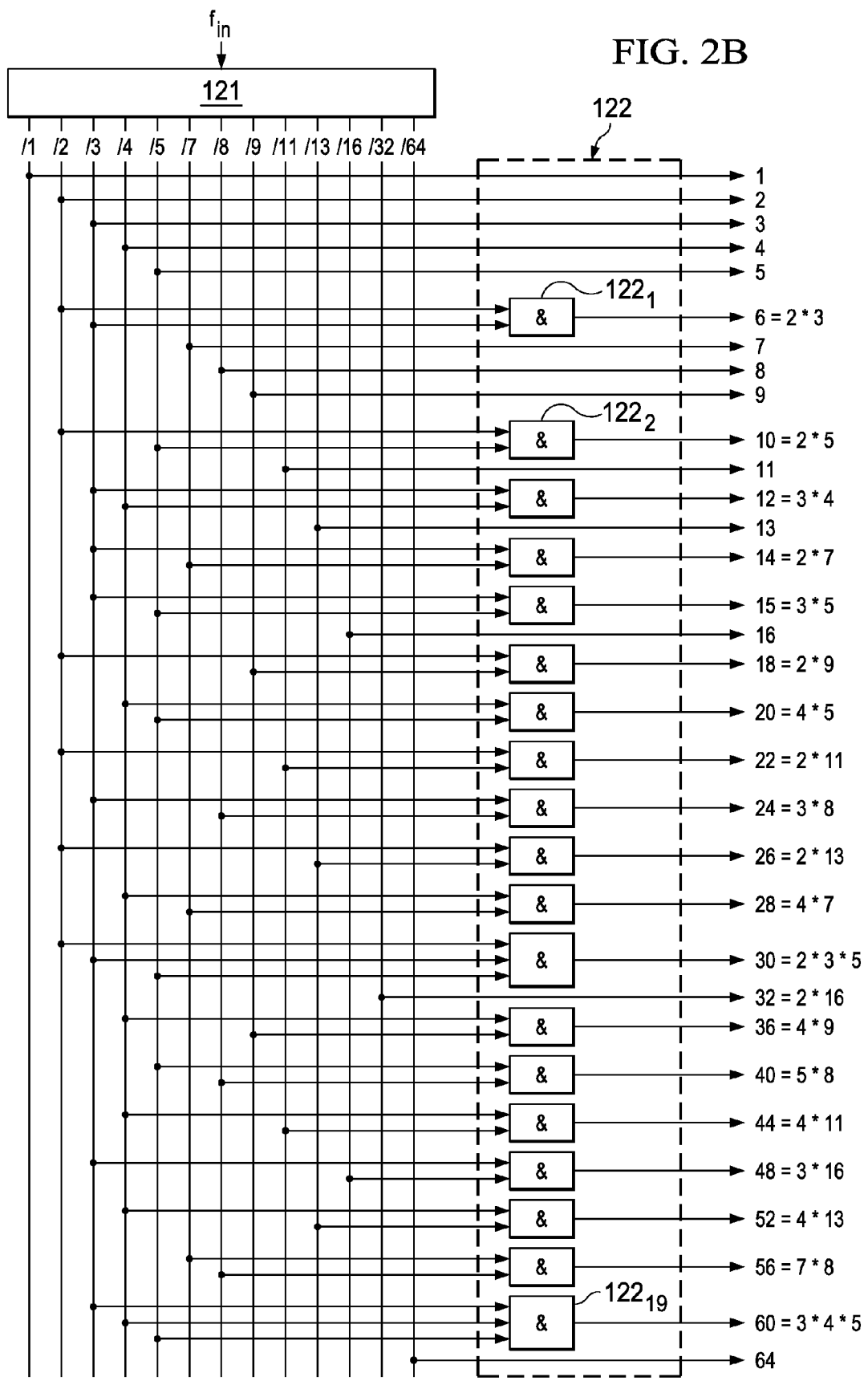

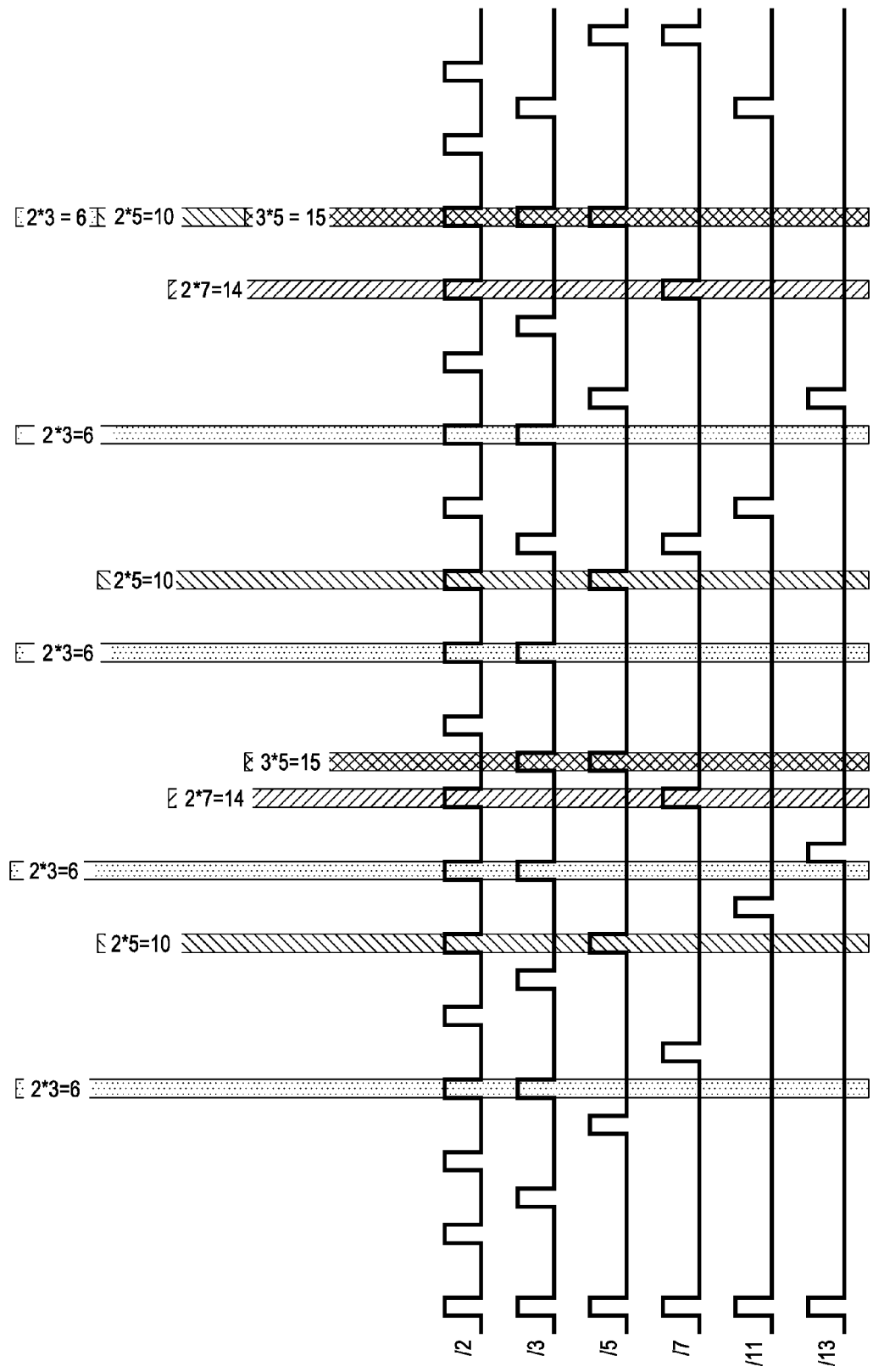

SHARED DIVIDE BY N CLOCK DIVIDER

FIELD

Disclosed embodiments relate to clock dividers.

BACKGROUND

A clock generator (or oscillator) is a circuit that produces a timing signal commonly referred to as a clock signal for use in synchronizing a circuit's operations. The basic parts that clock generators share include a resonant circuit or piezoelectric crystal and an amplifier, where the resonant circuit or piezoelectric crystal is often a quartz piezoelectric oscillator, although simpler tank circuits and RC circuits may also be used. The amplifier circuit usually inverts the signal from the oscillator and feeds a portion back into the oscillator's input to maintain an oscillation.

Clock circuits are used for a variety of purposes in circuits on both board level systems and integrated circuit (IC) devices. For example, global clock signals are used to synchronize operation of various circuits across a board or an IC device. More complex digital systems, such microprocessors, microcontroller units (MCUs) and field programmable gate arrays (FPGAs), utilize multiple clock signals at several different frequencies. For example, in some microprocessors, internal circuits are clocked by a first clock signal at a first (higher) clock frequency while input/output (I/O) circuits are clocked by a second (lower) clock signal at a second, different clock frequency. In a MCU system, a single clock source is generally distributed to multiple peripherals/modules, such as to analog-to-digital converters (ADCs), a universal serial bus (USB) controller, and a central processing unit (CPU) each needing a different (frequency) divider factor to provide their different frequency.

Multiple clock generating circuits can be used to generate the multiple clock signals at a plurality of different frequencies. However, systems can use a single clock generating circuit to derive all other clock signals from a first "reference" clock signal. For example, clock dividers functioning as frequency dividers can be used to generate one or more clock signals of lower frequencies from a reference clock signal, say from a frequency $f_{in}$. Typically, the clock dividers receive $f_{in}$ and divide $f_{in}$ by a set of integers given by $2^N$ using D flip flops for dividing $f_{in}$ by powers of two to generate output clock signals having $2^N$ divided frequencies being $f_{in}/2$, $f_{in}/4$, $f_{in}/8$ . . .

SUMMARY

This Summary briefly indicates the nature and substance of this Disclosure. It is submitted with the understanding that it will not be used to interpret or limit the scope or meaning of the claims.

Disclosed embodiments recognize it is desirable to share a clock frequency divider (clock divider) to save power and chip area for an integrated circuit (IC) that includes a processor (e.g., a microprocessor or microcontroller unit (MCU) chip)) and plurality of modules. Disclosed embodiments implement a shared divide by N (N=any desired integer) clock divider on the IC, where the clock divider includes a sub-divider block including multiple sub-dividers coupled to a divide by frequency combination circuit block for combining 2 or more received divider factor outputs from the sub-dividers.

The sub-dividers provide a frequency division by one or more prime numbers (for example, for a system supporting all integer divider factors from 1 to 16: a sub-divider for each prime number being 2, 3, 5, 7, 11, 13) and one or more of the prime numbers raised to an integer power ($2^2$, $2^4$, $3^2$) in a predetermined range of divider factors (predetermined divider range) set by the prime dividers. For those other divider factors that are desired within the predetermined divider range that are not prime numbers or their integer powers, 2 or more different "taps" of any of the sub-dividers' output prime number or their raised powers can be combined by divide by frequency combination circuitry (e.g., logic circuitry, such as AND, OR, NAND or NOR gates) to generate these other divider factors for any integer divider factor(s), such as 2*3=6, $2^2$*3=12, and 3*5=15.

Decoding logic can select the correct taps for the collective needs for each of the modules that enables the respective modules using their own dedicated frequency selector circuit to receive a custom clock frequency or custom set of clock frequencies. This arrangement eliminates the need for conventional global and centrally controlled clock lines where each module selects one clock line to use and often needs additional circuitry to divide the frequency down further.

In systems where a wide range of divider factors are needed but not all integer factors are needed, for disclosed embodiments it may be desirable to save chip area and only provide a limited set of the prime divider factors within the predetermined divider range. For example, the only prime numbers needed may be 2, 3 and 5 for the predetermined divider range of 1 to 15, but higher powers of the chosen prime numbers may also be generated by disclosed clock dividers. This arrangement allows, for one example, example divider factors to be provided that are beyond the predetermined divider range, such as $2*3*5^2=150$, $2*3^2*11=198$ and $2^4*3*5=240$.

BRIEF DESCRIPTION OF THE DRAWINGS

Reference will now be made to the accompanying drawings, which are not necessarily drawn to scale, wherein:

FIG. 2B shows example sub-divider outputs from a disclosed sub-divider block coupled to divide by frequency combination circuitry of a divide by frequency combination circuit block which taps the sub-dividers' outputted prime numbers or their powers for implementing a clock divider providing 32 divisor factors in the range from 1 to $2^M*N$, where N: 1 . . . 16 and M: 0 . . . 2, according to an example embodiment.

FIG. 3 is an example depiction that shows how different divisor factors can be generated by selecting different taps of any of the sub-dividers' outputted prime numbers or their powers and multiplying two or more of them together using divide by frequency combination circuitry to generate these other divider factors (numbers), according to an example embodiment.

DETAILED DESCRIPTION

Figure 1:
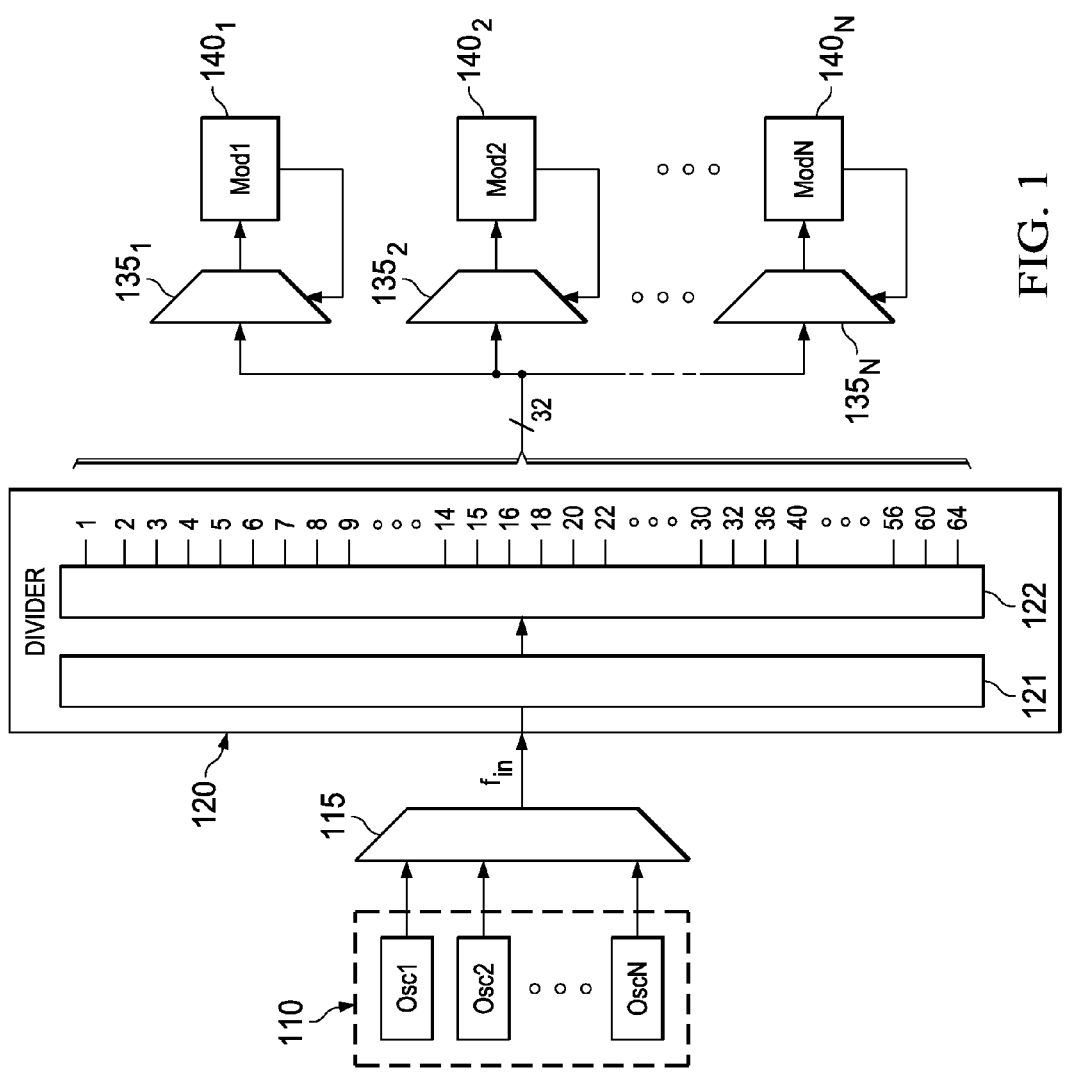
FIG. 1 is a depiction of an example shared divide by N clock divider (clock divider) including a sub-divider block coupled to a divide by frequency combination circuit block providing 32 different divisor factors (shown in a range from 1 to 64) to each module on the IC, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed embodiments include a shared clock divider that provides clock signals to each of the modules (or "peripherals" as generally used for processors) on the IC, with minimal to no area increase and similar power consumption as compared to a conventional divide by $2^N$ clock divider, which can simplify the user' experience significantly. Conventionally, ICs supporting multiple modules requiring a wide range of frequencies use a set of global clock lines each providing different frequencies. Each global clock line has its own (often centrally) configurable clock divider and each module can select which of the global clock lines to use. Usually some clock lines carry higher frequencies while other carry lower frequencies, and if no module is using one (or more) particular clock lines it can be switched off to save power. The total size of the clock divides for each global clock line (and possible additional dividers inside each module, because not all requirements can generally be fulfilled with a limited set of global clocks) is not smaller than what is required by disclosed shared divide by N clock dividers. Also, since with disclosed dividers using decoding logic each module can select exactly what clock frequency(ies) it needs, and unused/turned-off modules do not need any clock, so that the IC can utilize only the absolute minimum number of needed clocks (with all other clocks switched off) to save power.

FIG. 1 is a depiction of an example divide by N clock divider (clock divider) 120 providing 32 different frequency divisor factors shown in an example range from 1 to 64 to each module shown as Mod1 $140_1$, Mod2 $140_2$, ... ModN 140N on an IC, according to an example embodiment. Clock divider 120 is shown comprising a sub-divider block 121 (having frequency sub-dividers (sub-dividers) $121_1$, $121_2$, $121_3$, $121_4$, $121_5$, $121_6$ shown in FIG. 2 described below) coupled to a divide by frequency combination circuit block 122 (having frequency combination circuitry $122_1$ and $122_2$, ... $122_{19}$ shown in FIG. 2 described below). Sub-dividers $121_1$, $121_2$, $121_3$, $121_4$, $121_5$, $121_6$ can comprise logic such as AND, OR gates or D flip flops (e.g., arranged as counters periodically counting to the desired sub division factor). In the case of flip flops, the overflow signal when the counter transitions from non-zero value to zero can, for example, be used as the output.

Frequency combination circuitry $122_1$ and $122_2$, ... $122_{19}$ can comprise logic such comprising AND, OR, NAND, or NOR gates. The output of clock divider 120 comprises outputs from sub-divider block 121 (without any frequency combination, such as f1 (=fin), f2) and outputs from frequency combination circuit block 122 which combines 2 or more outputs from the sub-divider block 121. All components shown in FIG. 1 can be formed on the same substrate of a chip, such as an MCU or a microprocessor.

Clock divider 120 is shown including clock sources/oscillators block 110 including a plurality of oscillators shown as OSC1, OSC2 ... OSCN that each generate a different frequency. Alternatively, the clock sources/oscillators can be implemented as crystal oscillators formed off-chip or on-chip RC oscillators or any combination thereof, with other components shown in FIG. 1 being on chip. Each of the clock sources/oscillators can also generally comprise other clock sources such as including phase lock loops (PLLs), and digitally controlled oscillators (DCOs).

Optional frequency selector circuit 115 shown in FIG. 1 which can comprise a multiplexer MUX, is shown receiving outputs from the respective oscillators OSC1, OSC2, ... Osc N in clock sources/oscillators block 110, which is configured for selecting one of those frequencies. The output of frequency selector circuit 115 is a reference clock signal shown having a frequency $f_{in}$ that is coupled to an input of the sub-divider block 121 of clock divider 120.

The clock divider 120 provides outputs that can include any combination of the integer (N) divider factors in a predetermined range, to frequency selector circuits $135_1$, $135_2$, ... $135_N$ that are coupled to an input of respective modules shown as module Mod1, Mod2, ModN. Frequency selector circuits $135_1$, $135_2$, $135_N$ can comprise a MUX. The modules Mod1, Mod2, ModN are shown providing frequency select control signals to the frequency selector circuits $135_1$, $135_2$, $135_N$. For example, as described below (see FIG. 5 that shows an example MCU), the modules can each include their own configuration register that stores the clock frequency(ies) that they operate at, and in one embodiment with a suitable user interface and program run by a processor, a user is enabled to independently program custom clock frequency(ies) for the modules.

Figure 2A:
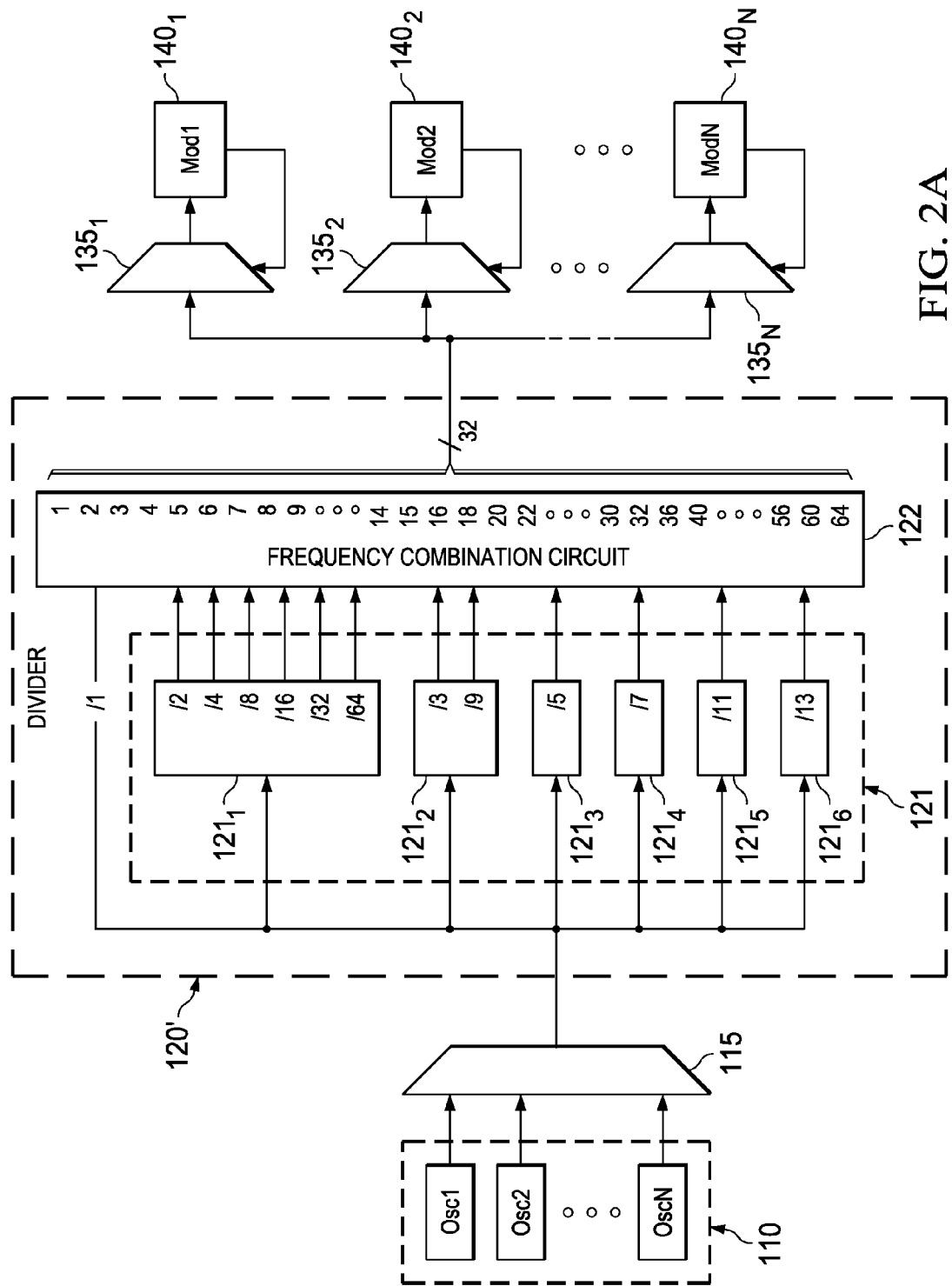
FIG. 2A shows example clock divider with the sub-dividers of the sub-divider block shown coupled to a divide by frequency combination circuit block which taps the sub-dividers' outputted prime numbers or their powers for implementing a clock divider providing 32 divisor factors in the range from 1 to $2^M*N$, where N: 1 . . . 16 and M: 0 . . . 2, according to an example embodiment.

FIG. 2A shows an example clock divider shown as clock divider 120' with its the sub-divider block 121 showing its respective sub-dividers $121_1$, $121_2$, $121_3$, $121_4$, $121_5$, $121_6$ having their outputs coupled to divide by frequency combination circuit block 122. In this example (div=$2^M*N$) the clock divider 120' generates 32 divider factors of the 64 possible divider factors from 1 to 64 (1 to $2^M*N$, where N: 1 ... 16 and M: 0 ... 2). In this embodiment, the predetermined divider range generated by sub-divider block 121 is 1 to 16 being the output range of the prime dividers, while the output range of the clock divider 120' enabled by frequency combination circuit block 122 combining two or more of the prime dividers is 1 to 64.

Clock divider 120' is thus shown generating all divider factors from 1 to 16, then every second divider factor from 16 to 32, and finally every fourth divider factor from 32 to 64. To generate any integer divider factor from 1 to 64 a disclosed clock divider can implement a sub-divider for all prime numbers in that range, which would be 18 sub-dividers. Accordingly, clock divider 120' implementing only the first 6 prime number (of the 18 possible in the range from 1 to 64) may be considered a favorable cost/benefit compromise.

The respective sub-dividers $121_1$, $121_2$, $121_3$, $121_4$, $121_5$, $121_6$ provide frequency division by prime numbers and prime numbers raised to an integer power that can fill selected integers in a predetermined range of divider factors for prime numbers and prime numbers raised to an integer power. As noted above, for those other divider factors in the predetermined range that are not prime numbers or their integer powers, different taps of any of the frequency sub-dividers' prime number or their powers can combined by divide by frequency combination circuit block 122 shown as including frequency combination circuit $122_1$, frequency combination circuit $122_2$ ... frequency combination circuit $122_{19}$ identified in FIG. 2B which can comprise logic shown as AND gates configured to generate these other divider factors (integers) for any of these other divider factors, such as 2*3=6 by frequency combination circuit $122_1$, and 2*5=10 by frequency combination circuit $122_2$. As noted above, besides AND gates, the frequency combination circuits can comprise other logic gates, such as OR, NAND or NOR gates.

Frequency combination circuits $122_1$ and $122_2$ which tap the sub-dividers' block's 121 outputted prime numbers or their powers implement a frequency divider providing a divider factor range with divider factors in the range from 1 to 2M*N, where N: 1 ... 16 and M: 0 ... 2, according to an example embodiment. A divider factor of 1 simply allows fin to pass through without any frequency division. Sub-divider $121_1$ provides frequency divisions by integer powers of 2 through 64 (2 to $2^6$), while sub-divider $121_2$ provides frequency divisions by integer powers of 3 including 3 and 9. Although not shown, circuitry can be included between fin and the inputs of sub-divider block 121 to provide optional clock gates for clock gating that if implemented can provide power savings.

Accordingly, any clock divider factor for a given predetermined range shown as 1 to 64 can be individually generated by clock divider 120', with the outputs from sub-divider block 121 generating divider factors by prime numbers and prime numbers raised to an integer power, with divide by frequency combination circuits $122_1$ and $122_2$ receiving divider factors from the sub-dividers $121_1$, $121_2$, $121_3$, $121_4$, $121_5$, $121_6$ for providing the other divider factors to any of the modules on the chip, such as a microprocessor (which are commonly referred to as peripherals) or a MCU.

FIG. 3 is an example depiction showing how different divisor factors can be generated by selecting different 'taps' of any of the sub-dividers' outputted prime numbers or their powers outputs from sub-divider block 121 and combining them using a divide by frequency combination circuit block 122 to generate other divider factors (integers), according to an example embodiment. The sub-dividers' prime number outputs are shown as $f_2$, $f_3$, $f_5$, $f_7$, $f_{11}$ and $f_{13}$ are all the prime numbers in the range from 1 to 16. $f_6$ (frequency division by 6) is shown generated by selecting and combining taps from f2 and f3 and f15 is shown generated by selecting and combining taps from f3 and f5.

The divider factors shown generated in FIG. 3 are suitable for providing to four modules (say Module 1, Module 2, Module 3 and Module 4) each having different clock frequency needs. For example, Module 1 may be provided a divider factor of 6 by combining fin/2 and fin/3, Module 2 provided a divider factor of 10 by combining fin/2 and fin/5, Module 3 provided a divider factor of 14 by combining fin/2 and fin/7, and Module 4 provided a divider factor of 15 by combining fin/3 and fin/5. The depiction is visualized at what periodical time points each Module receives a clock. Modules 1, 2 and 4 all receive a clock at the same time (approximately) at clock 30, which corresponds to the least common multiple (LCM) of the 3 divider factors, LCM (5, 10, 15)=30.

Figure 4:
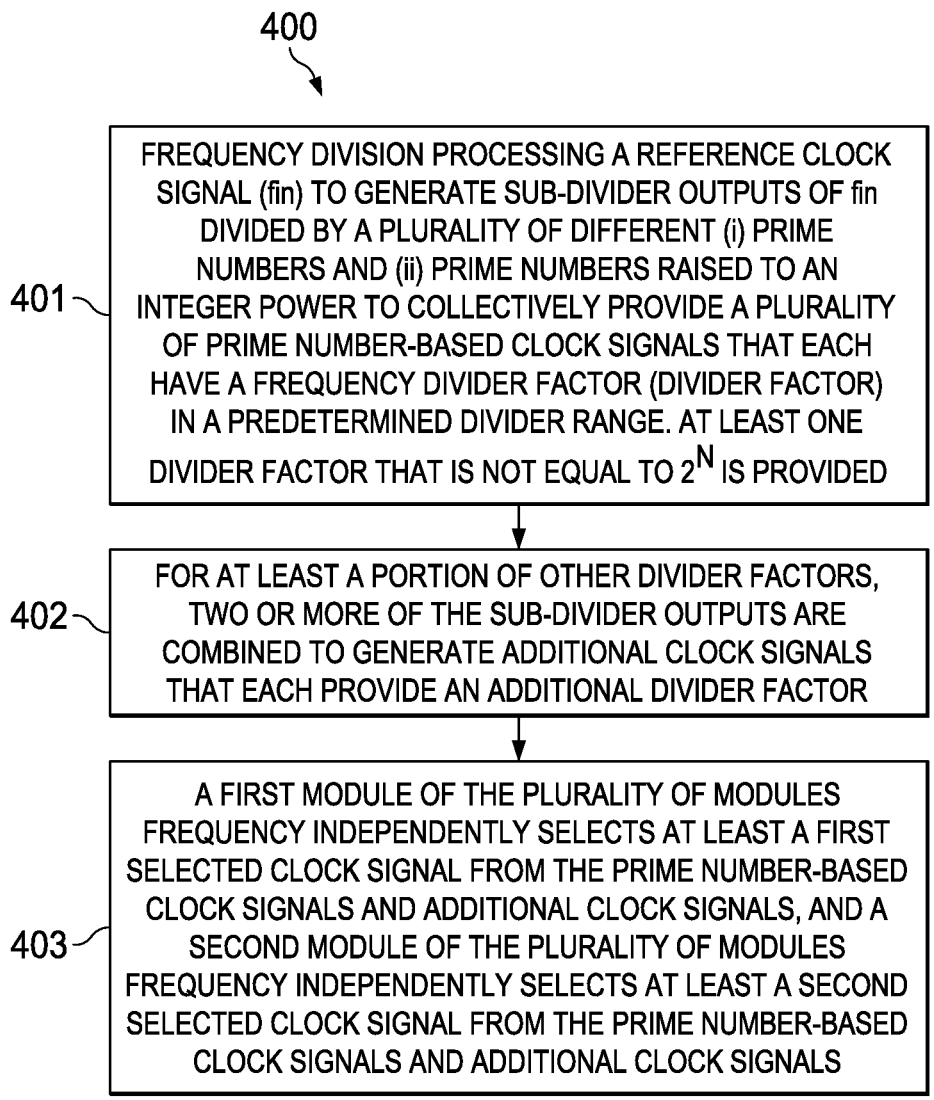
FIG. 4 is flow chart that shows steps in an example method of divide by N clock generation, according to an example embodiment.

FIG. 4 is flow chart that shows steps in an example method 400 of divide by N clock generation for an integrated circuit having a plurality of modules (or peripherals), according to an example embodiment. Step 401 comprises frequency division processing a reference clock signal (fin) to generate sub-divider outputs of fin divided by a plurality of different (i) prime numbers and (ii) prime numbers raised to an integer power to collectively provide a plurality of prime number-based clock signals that each have a frequency divider factor (divider factor) in a predetermined divider range. At least one divider factor that is not equal to $2^N$ is provided. Step 402 comprises for at least a portion of other divider factors, two or more of the sub-divider outputs are combined to generate additional clock signals that each provide an additional divider factor. In step 403, a first module of the plurality of modules frequency independently selects at least a first selected clock signal from the prime number-based clock signals and additional clock signals, and a second module of the plurality of modules frequency independently selects at least a second selected clock signal from the prime number-based clock signals and additional clock signals.

Figure 5:
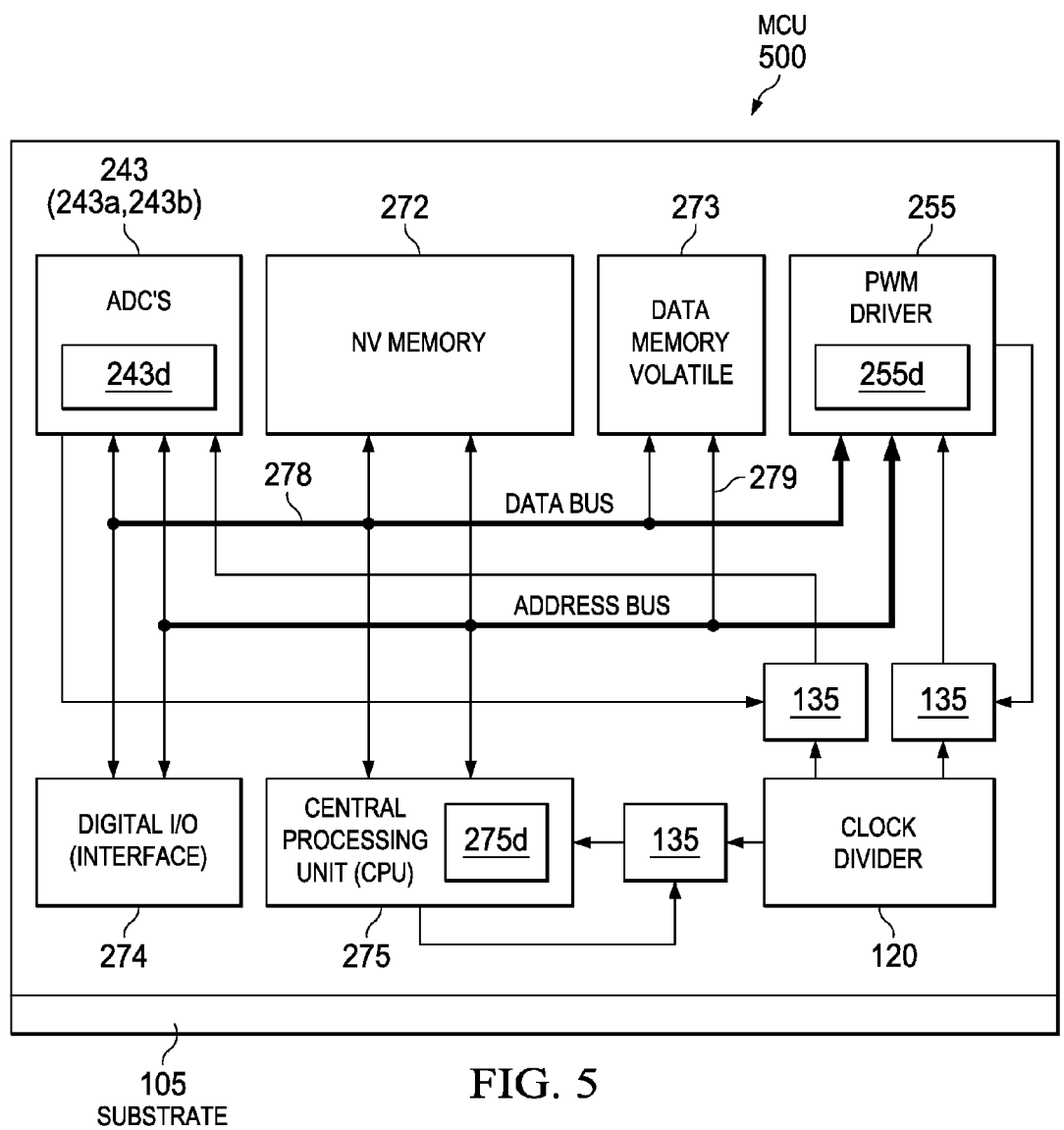
FIG. 5 is a block diagram depiction of an example MCU with a disclosed clock divider including selector logic (e.g., a multiplexer (MUX)) associated with certain of the modules for independently selecting the clock frequency(ies) for the module, according to an example embodiment.

FIG. 5 is a block diagram depiction of an example MCU chip 500 formed in and on a substrate 105 implementing the disclosed clock divider 120 shown in FIG. 1, according to an example embodiment. In operation of MCU 500, each module requests at least one divider factor and receives its clock(s) from the clock divider 120. MCU chip 500 includes selector logic shown as frequency selector circuits 135 (e.g., (MUX)) associated with certain modules on the MCU chip including ADC 243, CPU 275 and PWM driver 255 for independently selecting the clock frequency(ies) provided by the clock divider 120 for the respective module. "Modules" for an MCU chip may also be referred to in the art as being "peripherals". Although not shown, the MCU chip 500 generally includes other integrated circuit modules, for example, a Universal Serial Bus (USB) controller and a transceiver. MCU chip 500 is shown including (non-volatile) NV memory 272, volatile data memory 273, digital I/O (interface) 274, CPU 275, and clock divider 120. MCU chip 500 is also shown including a digital data bus 278 and an address bus 279.

Each module having selector logic provided by frequency selector circuit 135 has a user (via CPU 275) accessible configuration register shown as 243d for the ADC's, 255d for PWM driver 255, and 275d for CPU 275. In configuration or operation of MCU chip 500, with a suitable user interface, a user program running on the CPU 275 can be used to configure and store the N and M clock value(s) in the configuration register for each module separately to customize the clock frequency selection independent of the clock frequency(ies) selected by other modules on the MCU chip 500. The clock frequency selection(s) for each module on MCU 500 can therefore be fully user' programmable.

MCU chip 500 is shown as a monolithic integrated circuit (IC). The substrate 105 may comprise silicon, such as bulk silicon or silicon epi on a bulk silicon substrate. The substrate 105 may also generally comprise other materials, such as elementary semiconductors besides silicon including germanium. Substrate 105 may also generally comprise a compound semiconductor.

Advantages of disclosed divide by N clock dividers include a single shared (central) clock divider instead of multiple clock dividers and a simplified (decentralized) module configuration without the need for conventional global clock lines and their configuration because of disclosed decoding logic enables selecting the correct "taps" for each module. A simplified decentralized user-interface is provided because different "global" clock lines do not need to be implemented and configured to save power.

Those skilled in the art to which this Disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of providing multiple clock frequencies for an integrated circuit (IC) including a plurality of modules, comprising:
   frequency division processing of at least one reference clock signal (fin) to generate sub-divider outputs of said fin divided by a plurality of different (i) prime numbers and (ii) prime numbers raised to an integer power to collectively provide a plurality of prime number-based clock signals each providing a frequency divider factor (divider factor) in a predetermined divider range including at least one divider factor that is not equal to $2^N$, and
   for at least a portion of others of said divider factors that are not said prime numbers or said prime numbers raised to an integer power, combining combinations of two or more of said sub-divider outputs to generate additional clock signals that each provide an additional divider factor;
   a first of said plurality of modules frequency selecting at least a first selected clock signal from said plurality of prime number-based clock signals and said additional clock signals, and a second of said plurality of modules-frequency selecting at least a second selected clock signal from said plurality of prime number-based clock signals and said additional clock signals.

2. The method of claim 1, further comprising generating said fin using a frequency selector circuit comprising a multiplexer (MUX) that has inputs that receive outputs from a plurality of clock sources.

3. The method of claim 1, wherein said plurality of prime number-based clock signals provide all possible ones of said divider factors in said predetermined divider range, and said additional divider factors include at least one of said divider factors that is beyond said predetermined divider range.

4. The method of claim 1, wherein said plurality of prime number-based clock signals and said additional clock signals are generated by a single shared clock divider which provides said plurality of prime number-based clock signals and said additional clock signals to two or more of said plurality of modules.

5. The method of claim 4, wherein each of said two or more of said plurality of modules includes their own dedicated frequency selector circuit coupled to receive said plurality of prime number-based clock signals and said additional clock signals for performing said frequency selecting and selecting one or more of said plurality of prime number-based clock signals and said additional clock signals to output at least one custom clock frequency.

6. The method of claim 5, further comprising user programming said custom clock frequency using a user interface and a user program running on a processor, and storing said custom clock frequency in a configuration register.

7. A divide by N clock divider (clock divider) chip, comprising:
   a substrate having a semiconductor surface;
   a sub-divider block including a plurality of frequency sub-dividers (sub-dividers) for frequency division processing at least one received reference clock signal (fin) and for generating sub-divider outputs of said fin divided by a plurality of different (i) prime numbers and (ii) prime numbers raised to an integer power to collectively provide a plurality of prime number-based clock signals each providing a frequency divider factor (divider factor) in a predetermined divider range including at least one divider factor that is not equal to $2^N$, and
   a frequency combination circuit block including frequency combination circuits coupled to receive said sub-divider outputs for generating at least a portion of others of said divider factors that are not said prime numbers or said prime numbers raised to an integer power for combining combinations of two or more of said sub-divider outputs to generate additional clock signals that each provide an additional divider factor.

8. The clock divider of claim 7, wherein said frequency combination circuits comprise AND, OR, NAND or NOR gates.

9. The clock divider of claim 7, further comprising a plurality of frequency selector circuits each coupled to receive said plurality of prime number-based clock signals and said additional clock signals for performing frequency selecting configured to select one or more of said plurality of prime number-based clock signals and said additional clock signals to provide at least one custom clock frequency.

10. The clock divider of claim 7, wherein said plurality of prime number-based clock signals provide all possible ones of said divider factors in said predetermined divider range, and said additional divider factors include at least one of said divider factors that is beyond said predetermined divider range.

11. A microcontroller unit (MCU) chip, comprising:
   a substrate having a plurality of modules, a digital data bus, an address bus, a divide by N clock divider (clock divider), and frequency selector circuits formed therein and thereon, said plurality of modules including:
      at least one analog-to-digital converter (ADC);
      a pulse-width modulation (PWM) driver;
      a non-volatile (NV) program memory;
      a digital PO (interface);
      a central processing unit (CPU), and
   said clock divider including:
   a sub-divider block including a plurality of frequency sub-dividers (sub-dividers) for frequency division processing at least one received reference clock signal (fin) and for generating sub-divider outputs of said fin divided by a plurality of different (i) prime numbers and (ii) prime numbers raised to an integer power to collectively provide a plurality of prime number-based clock signals each providing a frequency divider factor (divider factor) in a predetermined divider range including at least one divider factor that is not equal to $2^N$, and
   a frequency combination circuit block including frequency combination circuits coupled to receive said sub-divider outputs for generating at least a portion of others of said divider factors that are not said prime numbers or said prime numbers raised to an integer power for combining combinations of two or more of said sub-divider outputs to generate additional clock signals that each provide an additional divider factor;
   said digital data bus and said address bus for coupling together said ADC, said NV program memory, said digital I/O (interface), said CPU, and said clock divider, and
   said frequency selector circuits for two or more of said plurality of modules coupled to receive said plurality of prime number-based clock signals and said additional clock signals for performing frequency selecting and selecting one or more of said plurality of prime number-based clock signals and said additional clock signals to output at least one custom clock frequency.

12. The MCU chip of claim 11, further comprising a selector circuit comprising a multiplexer (MUX) that has inputs that receive outputs from a plurality of clock sources which generates said fin.

13. The MCU chip of claim 11, wherein said plurality of prime number-based clock signals provide all possible ones of said divider factors in said predetermined divider range, and said additional divider factors include at least one of said divider factors that is beyond said predetermined divider range.

14. The MCU chip of claim 11, wherein said two or more of said plurality of modules further comprise a configuration register, and wherein said CPU is programmed for accepting user programming of said custom clock frequency and storing said custom clock frequency in said configuration register.

15. The MCU chip of claim 11, wherein said frequency combination circuits comprise AND, OR, NAND or NOR gates.

16. The MCU chip of claim 11, wherein said substrate comprises silicon.

* * * * *